United States Patent [19]

Van Hout

[11] Patent Number: 4,750,091
[45] Date of Patent: Jun. 7, 1988

[54] CIRCUIT BOARD ENCLOSURE LATCH SYSTEM

[75] Inventor: James E. Van Hout, Auburn Heights, Mich.

[73] Assignee: Chrysler Motors Corporation, Highland Park, Mich.

[21] Appl. No.: 947,150

[22] Filed: Dec. 29, 1986

[51] Int. Cl.$^4$ ............................................. H05K 5/00
[52] U.S. Cl. .................................... 361/395; 361/399
[58] Field of Search ...................... 200/295, 296, 329; 248/27.1, 27.3; 361/346, 380, 391, 394–395, 399, 415; 211/41

[56] References Cited

U.S. PATENT DOCUMENTS 4,092,698  5/1978  Brefka ................................. 361/346
4,573,104  2/1986  Kamada .............................. 361/394
4,652,969  3/1987  Stegenga ............................ 361/399

Primary Examiner—A. D. Pellinen
Assistant Examiner—Greg Thompson
Attorney, Agent, or Firm—Wendell K. Fredericks

[57] ABSTRACT

The fastening of a circuit board in a housing that has a front faceplate panel with actuating means thereon for activating switches that are mounted on the circuit board is effected by a self-compensating latch apparatus. The apparatus employs a plurality of mounting ledges molded to the side walls of the housing and spaced a chosen distance from the font panel upon which the circuit board rests. A plurality of resilient fingers with locking devices attached to each finger are integrally molded within the walls of the housing near the mounting ledges. The fingers flex away from the edges of the circuit board as the board is introduced into the housing via a rear opening. Then the fingers flex inwardly causing arch-shaped members of the locking devices to move over the rear edge of the circuit board to a location whereat the front of the circuit board is locked against the ledges. By use of this invention, circuit boards of varying thicknesses can be locked into such a housing. Another embodiment is disclosed that includes locking devices having tapered faced members for making point-contact with the edges of the circuit board.

7 Claims, 3 Drawing Sheets

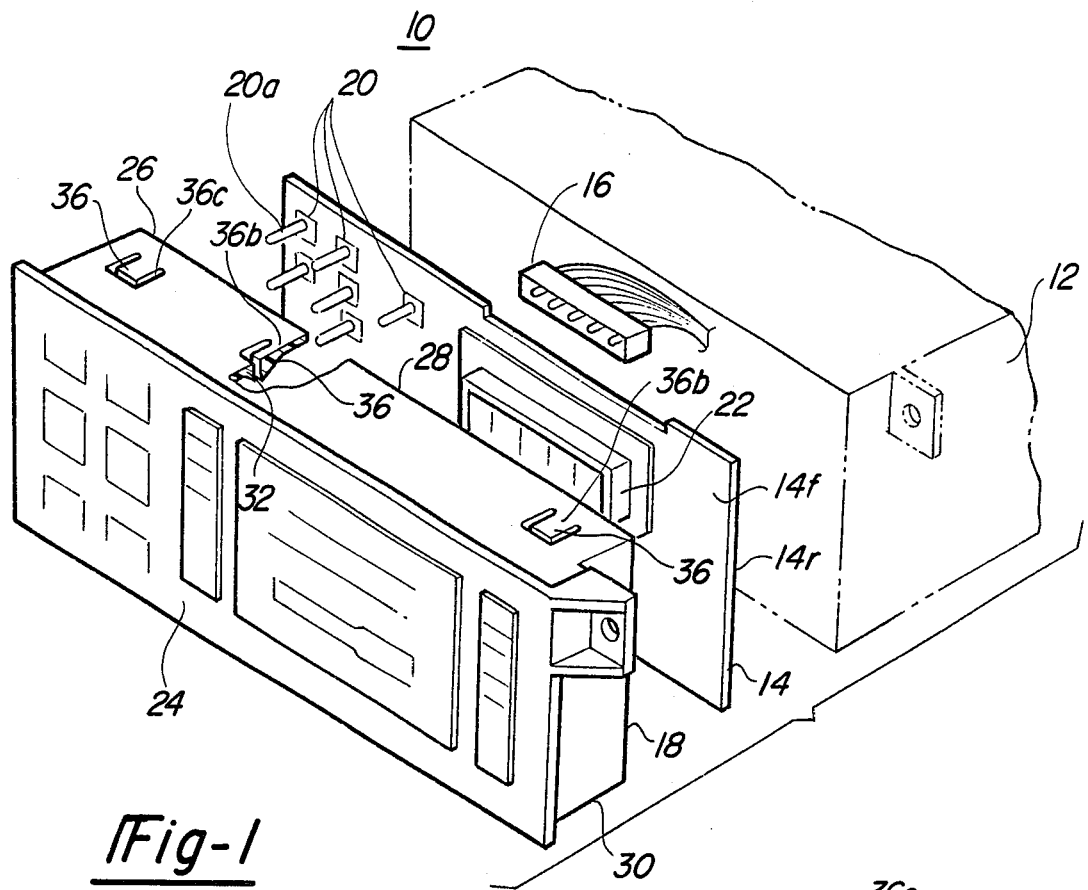
Fig-1
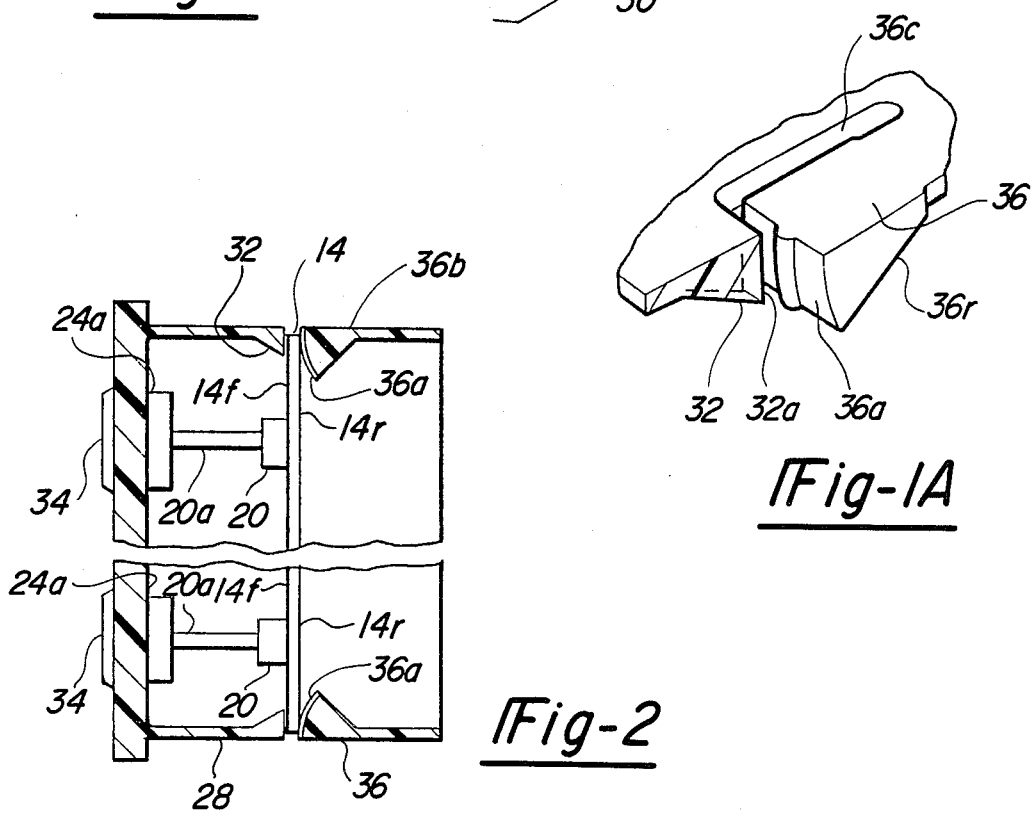
Fig-1A
Fig-2

CIRCUIT BOARD ENCLOSURE LATCH SYSTEM

BACKGROUND OF THE INVENTION

1. Field of the Invention

The present invention relates generally to printed circuit board mounting schemes and, particularly, to printed circuit board mounting and locking schemes for use, for example, in pushbutton type radio systems of the type wherein pushbuttons on a faceplate panel of an enclosure are used to actuate switches mounted on a printed circuit board disposed within the enclosure in spaced, parallel alignment with the faceplate panel.

2. Description of the Prior Art

In prior art circuit board systems, it is well known to mount conventional momentary-action switches on circuit boards, and then to fixedly mount the circuit board in the enclosure in spaced, parallel alignment with the faceplate panel. Actuating devices, such as pushbuttons are mounted on the faceplate panel and are mechanically connected to the switches on the circuit board.

To operate a switch, e.g., an ON/OFF switch, the pushbutton is manually pressed a first time to make a circuit and pressed a second time to break the circuit. Each manual depression of the pushbutton causes a straight line compressive force to be translated from the pushbutton to the circuit board through the switch. This means of actuating the switch requires the circuit board to be fixedly mounted within the enclosure. The circuit board should be positively secured in position so that no movement is allowed at support points. If any movement occurs, the tolerances of switch activation increase and require greater travel of the pushbuttons. Generally, the circuit board in such arrangements is secured to the enclosure by means of fasteners such as screws and other board support means.

An illustrative environment where application of the principles of the present invention is particularly advantageous is in circuit board enclosures for electrical instrument circuits such as, for example, the "Protective Case for Electrical Instruments on Circuit Boards," U.S. Pat. No. 4,092,698 of Brefka dated May 30, 1978. There, an electrical instrument is enclosed in an injection molded housing having a front opening, four side walls and a rear wall, The front opening is for inserting a circuit board therein. In order to provide for mounting the circuit board, four triangular shaped corner ledges are molded along with the rest of the structure with upper surfaces positioned to support a rear-surface of the circuit board. The front surface of the circuit board is engaged by bevelled front faces at the ends of opposed pairs of resilient fingers which extend with an inward cant from opposite interior side walls into the interior of the structure. The bevelled front face of each resilient finger includes a succession of steps or ridges spaced closely together forming a stepped front face that is capable of constraining the circuit board between the ledge and the stepped face.

As the circuit board is introduced into the housing, the fingers flex away from the edge of the circuit board. When the circuit board is against the ledge surfaces, the clearances between the lower edge of the bevelled front faces and the circuit board will permit the resilient fingers to flex inwardly to bring the vertical stepped front faces into engagement with the circuit board thereby latching the circuit board into the housing with some clearance which will likely allow slight circuit board movement.

Such an arrangement permits the circuit board to be latched in the housing automatically upon its introduction therein, without resort to separate fastening means or tools. However, such an arrangement is suitable for pushbutton and switch systems that are high travel systems wherein the switches may operate satisfactorily even though there is "play" or movement of an end of the circuit board supported between the support ledge and the best-fit step of the plurality of steps in the front face of each of Brefka's resilient fingers. Switch systems that are low travel systems; i.e., switches that operate with very little or no pretravel of the plunger, cannot tolerate a loosed fit of the ends of the circuit board between the support edge and the stepped face. The circuit board must be securely held with no movement allowed in order to prevent adding any pushbutton and switch pretravel distance due to board movement.

Meshing, with a high degree of accuracy, the step gradations on the front faces of Brefka's resilient fingers with the end portion of the circuit board is a formidable task. A space gap will undoubtedly exist between the circuit board and the best-fit stepped face as the circuit board rest on the ledge. This gap is a result of the circuit board being of a smaller thickness than the distance provided between the ledge and the best-fit step on the bevelled face. If the technique of increasing the number of steps to minimize the gap is employed, each increase in the number of steps will either reduce the step length or will increase the overall length of the bevelled stepped face. Both such conditions are usually undesirable for molded latch enclosure systems due to excessive stress at the flexing pivot points of the fingers or due to an unreliable latch overlap of the step.

BRIEF SUMMARY OF THE INVENTION

The present invention concerns self-compensating, circuit board locking mechanisms for automatically locking circuit boards of varying thickness in circuit board enclosures. The system is directly applicable to circuit board enclosures wherein the enclosure has a front face panel with actuating means that mate with switches mounted on the circuit board.

Mounting ledges are disposed along a first pair of side walls at a chosen distance from the front panel of the enclosure. The mounting ledges provide support for a front surface of the circuit board when it is introduced into the enclosure. A plurality of resilient fingers are molded within the pair of side walls, each of the fingers being disposed near one of the mounting ledges. Locking devices are molded to the ends of the fingers for forcing the circuit board against the mounting ledges so that there is no clearance and therefore no circuit board movement allowed.

When the circuit board is introduced into the enclosure, the resilient fingers are flexed outwardly by a front edge of the circuit board engaging a ramp-shaped member of the locking devices. The front edge of the circuit board stays in contact with the ramp-shaped member of the locking devices until it reaches an interface between the ramp-shaped member and an arch-shaped member of the locking devices. As the circuit board is moved further towards the ledges, the end of the circuit board passes the interface on each finger until the rear edge of the circuit board crosses the interfaces. Then the fingers flex inwardly as the arch-shaped members move along the surface of the rear edge of the circuit board away from the interface to the points-of-contact where the rear edge of the circuit board is fixedly engaged with the surfaces of the locking members at a particular lock or tangential angle with the surface of the locking memger. This tangential angle must be maintained sufficiently small for all the variety of thicknesses of circuit boards in order to prevent the resilient fingers from springing back when force is exerted against the actuation means.

DESCRIPTION OF THE DRAWING

FIG. 1 is an exploded perspective view of a pushbutton radio system with a faceplate panel enclosure that connects with a circuit board in accordance with the present invention;

FIG. 1A is a perspective sectional view of a resilient finger of FIG. 1;

FIG. 2 is a sectional side view of the faceplate panel and circuit board illustrative of the locking position of the ledges and fingers of this invention;

DESCRIPTION OF A PREFERRED EMBODIMENT

Figure 3A:
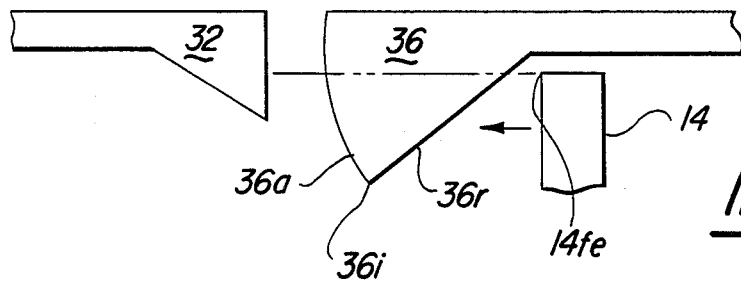
FIGS. 3A, FIG. 3B and FIG. 3C are side views of the finger, ledge and circuit board illustrative of the operation of the locking devices attached to the fingers during insertion of a circuit board into the enclosure.

FIG. 1 is illustrative of a pushbutton radio system 10 utilizing circuit board locking principles of this invention. The radio system includes a main radio assembly 12, a circuit board enclosure 18, a rectangular shaped circuit board 14 and, a cable assembly 16 connecting the radio assembly to the circuit board and.

Mounted on the circuit board 14 along with various circuit components are pushbutton switches 20 and a display module 22. The switches and display module are input and output devices used by an operator for interfacing with the main radio assembly 12 via cable assembly 16.

Enclosure 18, an injection molded plastic structure has a rectangular shaped faceplate panel 24, a rectangular shaped rear opening 26 for insertion of the circuit board 14, a first pair of side walls 28 extending the length of the faceplate panel and a second pair of two side walls 30 extending the width of the faceplate panel.

In order to provide for mounting circuit board 14 within enclosure 18, a chosen number of ledges 32 of FIG. 1A, each of the ledges having a flat surface 32a for supporting a front surface 14f of circuit board 14, are molded along with the rest of the enclosure at chosen locations along the side walls 28.

In order to identify each switch and to provide a means for operating them without touching the circuit board, the front panel 24 of enclosure 18 has a plurality of holes 24a of FIG. 2 therein through which a plurality of actuators such as pushbuttons 34 extend so as to couple with a plurality of plungers 20a extending from the switches 20 mounted on the circuit board (best seen in FIG. 2).

Figure 3B:
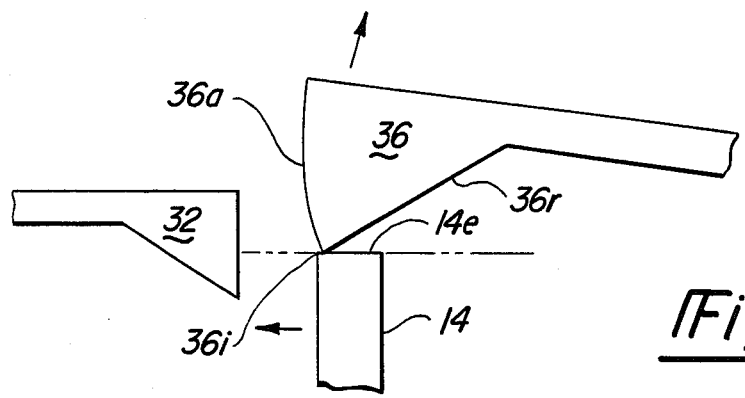
Figure 3C:
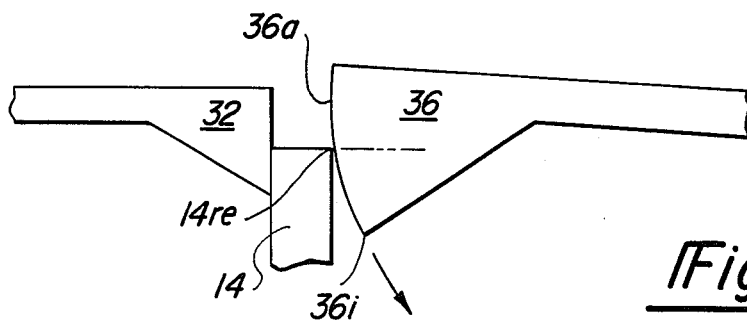

A rear edge 14re (best seen in FIG. 3C) of circuit board 14 is engaged by arch-shaped members 36a disposed at the end of a chosen number of opposed pairs of resilient fingers 36 of FIG. 1, each of the fingers being near each of the mounting ledges. These fingers extend from pivotal regions 36b with an inward cant from opposite interior sides of side walls 28 into the interior of enclosure 18. As shown in FIG. 1, each finger 36 is formed integrally with the enclosure 18 from injection molded plastic in an opening 36c (best seen in FIG. 1A) in the side walls 28.

Hence, as the circuit board 14 is inserted into enclosure 18 (See FIGS. 3A, 3B and 3C), the resilient fingers 36 are flexed outwardly by a front edge 14fe of the circuit board that engages the ramp-shaped member 36r of the fingers. The front edge 14fe stays in contact with member 36r until it reaches an interface 36i between member 36r and the arch-shaped member 36a of fingers 36. As the circuit board 14 is moved further towards the ledges, the end 14e of the circuit board moves past the interface 36i until the rear edge 14re of the circuit board crosses the interface. Then the fingers 36 begin to return toward the unstressed position, flexing inwardly towards the interior of the enclosure. As the fingers are returning, the rear edges 14re of the board 14 move over the surfaces of the members 36a toward a location whereat the edges 14re are fixedly engaged with the surfaces of members 36a at a particular lock or tangential angle which securely locks the board 14 against the ledges 32. Also, the pushbuttons 34 of FIG. 2 are brought into coupled relationship with all the plungers 20a of the switches 20 mounted on the circuit board.

Figure 4A:
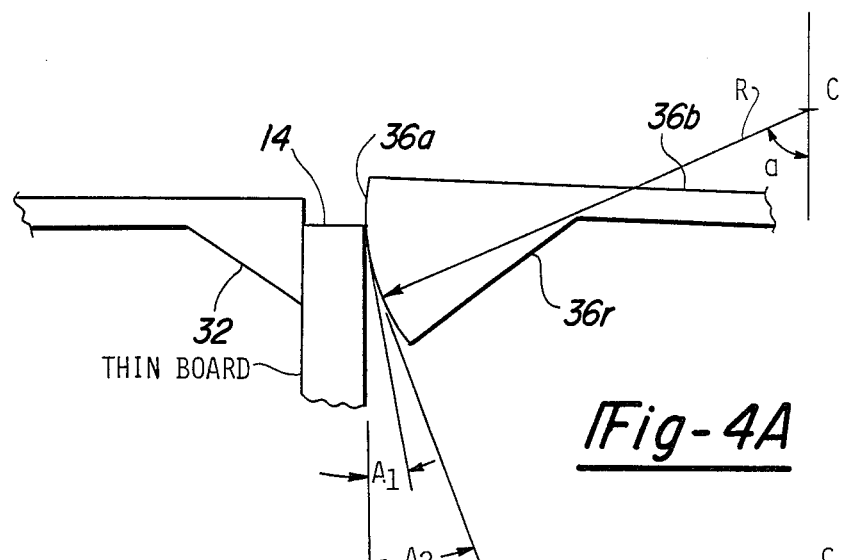
FIG. 4A and FIG. 4B are illustrative of a constant critical angle and a slightly varying locking angle between circuit boards of different thicknesses and the arch shaped face of the lock finger of the present invention.
Figure 4B:
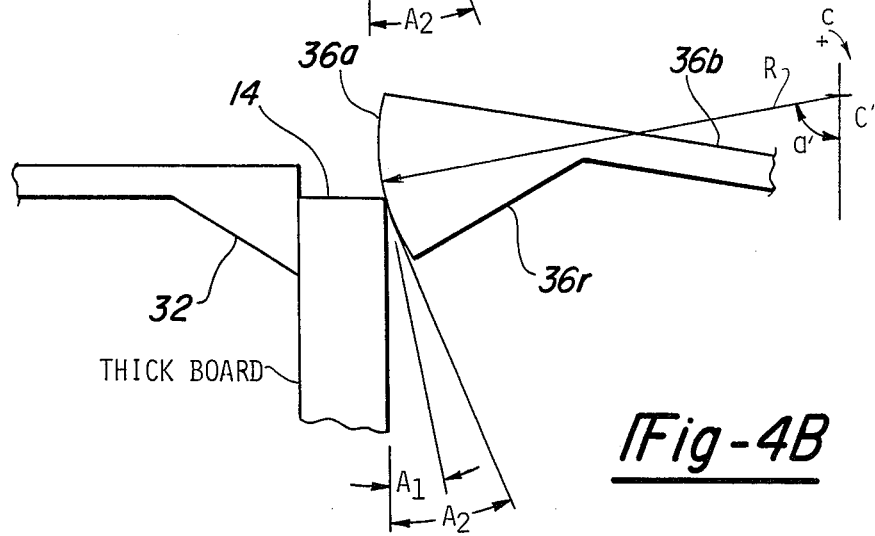

As illustrated in FIGS. 4A and 4B, the members 36a, when locked against the rear edge 14re of board 14 forms a tangent line at a chosen lock angle A1 that must be maintained sufficiently small for all the variety of thicknesses of circuit boards in order to prevent the resilient fingers from springing backward when force is exerted against the switches. Fig. 4A depicts a thin board; FIG. 4B depicts a thick board. A board may be, illustratively, 0.055 to 0.065 inches thick and the lock angle will remain virtually the same. The angle "a" that radius R of the arch-shaped member 36a makes with the rear edge 14re of the circuit board 14 does not remain constant for the various board thicknesses. The fingers also self adjust by flexing appropriately in order for the lock angle to be less than the critical angle for the various thicknesses of the boards. The finger arches must be designed so that the critical angle A2 is larger than the lock angle A1. The critical angle A2 is defined as the largest angle between the arch-shaped members and the rear edge 14re of the circuit board 14 that could be used to keep the board locked against the ledges.

As illustrated in FIGS. 4A and 4B, the arch of the arch-shaped member 36a of the resilient fingers 36 is a suitable sized sector of a circle whose radius extends from a center "c". The center "c" is disposed outside of the plane of the side walls 28. Both the center position and radius length are chosen such that the arch of the arch-shaped members of the fingers engage the rear edge 14re of the circuit boards at approximately the same lock angle throughout a chosen range of circuit board thicknesses.

This locking technique, which permits maintaining a nearly constant lock angle, departs from the prior art locking approach employed to snap-in and retain circuit boards in circuit board enclosures.

Figure 5:
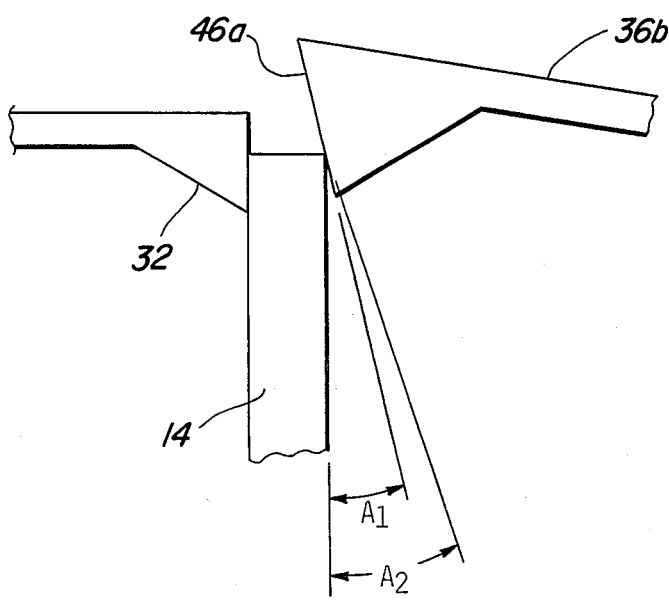
FIG. 5 is a side view of a tapered locking member of another embodiment of this invention.

Another embodiment of the self-compensating latches is shown in FIG. 5. There, a resilient finger 36 is depicted having a tapered locking member 46a rather than an arch-shaped member. Again, a lock angle associated with the tapered member is less than, but not equal to the critical angle that governs the stability of the system. The lock angle for a tapered locking member will vary for various thickness of circuit boards. Hence, if the proper lock angle is established between the tapered locking member 46a of the fingers and an appropriately sized circuit board, the circuit board will be locked within the housing as effectively as if the locking was performed using arch-shaped locking members.

While the present invention has been disclosed in connection with the preferred embodiment thereof, it should be understood that there may be other embodiments which fall within the spirit and scope of the invention and that the invention is susceptible to modification, variation and change without departing from the proper scope or fair meaning of the following claims.

I claim:

1. A circuit board enclosure latch apparatus that provides a self-compensating locking mechanism for fastening a circuit board in an enclosure, the apparatus comprising:
    (a) a housing having a front faceplate panel, a first pair of side walls, a second pair of side walls, and a rear opening, one side wall of said first pair of side walls extending the length of a top edge of said front faceplate panel and the other side wall of said first pair of side walls extending the length of a bottom edge of said front faceplate panel, said first pair of side walls having a plurality of openings therein that are spaced apart at a chosen distance from said front faceplate panel;
    (b) a plurality of ledge means formed within said housing, each one of said plurality of ledge means being integrally molded to said first pair of side walls at a location between said rear opening and said front faceplate panel and near one of the plurality of openings in said first pair of side walls, each of said plurality of ledge means having a flat surface facing said rear opening providing a level support area for receiving the circuit board;
    (c) a plurality of resilient fingers integrally molded to said first pair of side walls, each one of said plurality of fingers being molded at a location between said rear opening and said front faceplate panel within one of the plurality of openings in said first pair of side walls, said plurality of fingers having a pivotal region near an edge of the rear opening of the housing, an end of each of said plurality of fingers being disposed in the path of movement of a front surface of the circuit board as it is being inserted through said rear opening towards said ledge means;
    (d) a plurality of circuit board locking devices, each of which being integrally molded to the end of one of said plurality of fingers for fixedly locking the circuit board against said plurality of ledge means, each of said locking devices being comprised of a ramp-shaped member connected at an interface to an arch-shaped member, the ramp-shaped member being formed on an inner surface of each of said plurality of fingers so as to encounter a front edge of the circuit board as it is being inserted into said housing, and said arch-shaped member being formed at a distal end of each of said plurality of fingers so as to contact a rear edge of the circuit board, after an end of the circuit board passes the interface, in a manner that fixedly locks the circuit board against the flat surfaces of said plurality of ledge members.

2. Apparatus in accordance with claim 1 wherein each of said ramp-shaped members causes each of the plurality of fingers to flex outwardly as the front edge of the circuit board is encountered during insertion of the board, and wherein each of said arch-shaped members allows each of the plurality of fingers to return toward an unstressed position after the end of the circuit board passes over the interface and said arch-shaped members move over the rear edge of the circuit board as the board moves to a location which causes the front of the circuit board to become fixedly locked against said plurality of ledge means.

3. Apparatus in accordance with claim 2 wherein a tangent line at the point-of-contact where the rear edge of the circuit board makes contact with the surface of said arch-shaped member, remains substantially at a chosen tangential angle with respect to the rear surface of the circuit board even when varying thicknesses of circuit boards are locked in said housing and wherein the engagement of said arch-shaped member of each of said plurality of fingers against the rear edge of the circuit board at the point-of-contact is such that it eliminates any gaps in the space between said plurality of ledge means, the circuit board and said plurality of said locking devices.

4. Apparatus in accordance with claim 1 wherein the distal end of each of said plurality of fingers has a tapered member for engaging the rear edge of the circuit board at a single point of contact along the surface of the tapered member after the end of the circuit board passes an interface formed by the tapered member and the ramp-shaped member for fixedly locking the circuit board against the flat surfaces of said plurality of ledge means and wherein a lock angle of said tapered-shaped member varies slightly for varying thicknesses of circuit boards.

5. A circuit board enclosure latch apparatus that provides a self compensating locking mechanism fastening a circuit board in an enclosure, wherein the circuit board has mounted thereon a plurality of plunger actuated switches for making and breaking electrical circuits on the board, the apparatus comprising:
    (a) a housing having a front faceplate panel with a plurality of actuators mounted thereon in alignment with the plurality of switches mounted on the circuit board, a first pair of side walls, a second pair of side walls, and a rear opening, one side wall of said first pair of side walls extending the length of a top edge of said front faceplate panel and the other side wall of said first pair of side walls extending the length of a bottom edge of said front faceplate panel, said first pair of side walls having a plurality of openings therein that are spaced apart at a chosen distance from said front faceplate panel;
    (b) a plurality of ledge means formed within said housing, each one of said plurality of ledge means being integrally molded to said first pair of side walls at a location between said front faceplate panel and near one of the plurality of openings in said first pair of side walls, each of said plurality of ledge means having a flat suface facing said rear opening providing a level support area for receiving the circuit board;
    (c) a plurality of resilient fingers integrally molded to said first pair of side walls, each one of said plurality of fingers being molded at a location between said rear opening and said front panel and within one of the plurality of openings in said first pair of side walls, said plurality of fingers having a pivotal region near an edge of the rear opening of the housing, an end of each of said plurality of fingers being disposed in the path of movement of a front surface of the circuit board as it is being inserted through said rear opening towards said ledge means;

(d) a plurality of circuit board locking devices, each of which being integrally molded to the end of one of said plurality of fingers for fixedly locking the circuit board against said plurality of ledge means, each of said locking devices being comprised of a ramp-shaped member connected at an interface to an arch-shaped member, the ramp-shaped member being formed on an inner surface of each of said plurality of fingers so as to encounter a front edge of the circuit board as it is being inserted in said housing, and said arch-shape member being formed at a distal end of each of said plurality of fingers so as to contact a rear edge of the circuit board after an end of the circuit board passes the interface of the ramp-shaped and arch-shaped members, in a manner that fixedly locks the circuit board against the flat surfaces of said plurality of ledge means;

each of said ramp-shaped members causing each of the plurality of fingers to flex outwardly as the front edge of the circuit board is encountered during insertion of the board, and wherein each of said arch-shaped members allows each of the plurality of fingers to return toward an unstressed position after an end of the board passes over the interface and said arch-shaped members move over the rear edge of the circuit board as the board moves to a location which causes the front of the board to become fixedly locked against said plurality of ledge means.

6. Apparatus in accordance with claim 5 wherein a tangent line at the point-of-contact in which the rear edge of the circuit board makes contact with the surface of said arch-shaped member, remains at a constant chosen tangential angle with respect to the rear surface of the circuit board even when varying thicknesses of circuit boards are locked in said housing; wherein the engagement of said arch-shaped member of each of said plurality of fingers against the rear edge of the circuit board at the point-of-contact is such that it eliminates any gaps in the space between said plurality of ledge means, the circuit board and said plurality of said locking devices, even when varying thicknesses of circuit boards are locked in said housing and wherein the circuit board is locked within said housing in a manner which opposes movement in response to the plurality of switches mounted on the circuit board being pressed by force applied to the plurality of actuators on the front faceplate panel of the housing.

7. Apparatus in accordance with claim 6 wherein the distal end of each of said plurality of fingers has a tapered member for engaging the rear edge of the circuit board at a single point of contact along the surface of the tapered member after the end of the circuit board passes an interface formed by the tapered member and the ramp-shaped member for fixedly locking the circuit board against the flat surfaces of said plurality of ledge means and wherein the lock angle of said tapered-shaped member varies slightly for varying thicknesses of circuit boards.

* * * * *